United States Patent
Luft et al.

(10) Patent No.: US 8,626,468 B2
(45) Date of Patent: Jan. 7, 2014

(54) MEMS DEVICE COMPRISING OSCILLATIONS MEASUREMENTS MEANS

(75) Inventors: Ido Luft, Ra'anana (IL); Nir Goren, Moshav Herut (IL)

(73) Assignee: STMicroelectronics International N.V., Amsterdam (NL)

( * ) Notice: Subject to any disclaimer, the term of this patent is extended or adjusted under 35 U.S.C. 154(b) by 392 days.

(21) Appl. No.: 13/002,378

(22) PCT Filed: Jun. 21, 2009

(86) PCT No.: PCT/IL2009/000648
§ 371 (c)(1),
(2), (4) Date: Jan. 3, 2011

(87) PCT Pub. No.: WO2010/001388
PCT Pub. Date: Jan. 7, 2010

(65) Prior Publication Data
US 2011/0181931 A1    Jul. 28, 2011

(30) Foreign Application Priority Data
Jul. 2, 2008  (IL) .......................................... 192583

(51) Int. Cl.
*G02B 26/08*    (2006.01)

(52) U.S. Cl.
USPC ........................ 702/103; 359/224.1; 359/904

(58) Field of Classification Search
USPC .......... 359/198.1–199.4, 200.6–200.8, 202.1, 359/221.2, 223.1–225.1, 226.2, 904, 359/290–295, 838, 846, 871, 872; 250/204, 250/559.06, 559.29, 230, 234; 347/255–260; 353/39, 98–99; 385/15–18, 22; 398/12, 19, 45

See application file for complete search history.

(56) References Cited

U.S. PATENT DOCUMENTS

| | | | |
|---|---|---|---|
| 6,275,326 B1 | 8/2001 | Bhalla et al. | |
| 6,538,802 B2 | 3/2003 | Wang et al. | |
| 7,129,473 B2 * | 10/2006 | Ishihara et al. | 250/234 |
| 7,252,394 B1 | 8/2007 | Fu | |
| 7,586,659 B2 * | 9/2009 | Turner et al. | 359/199.1 |
| 7,973,942 B2 * | 7/2011 | Iyoki et al. | 356/614 |
| 2007/0064300 A1 | 3/2007 | Barnes et al. | |
| 2008/0043304 A1 | 2/2008 | Stalford | |
| 2009/0185250 A1 * | 7/2009 | Turner et al. | 359/199.1 |
| 2010/0315605 A1 * | 12/2010 | Arita | 353/98 |

FOREIGN PATENT DOCUMENTS

JP    2007017648 A    1/2007

* cited by examiner

*Primary Examiner* — Jennifer L. Doak
(74) *Attorney, Agent, or Firm* — Gardere Wynne Sewell LLP

(57) ABSTRACT

A MEMS apparatus is provided for scanning an optical beam which comprises: a. at least one mirror operative to perform am oscillation motion to a pre-defined rotation angle around a mirror rotation axis; b. a sound sensing means; and c. a conversion means operative to convert sound vibrations detected by the sound sensing means into one or more electrical signals, and wherein the sound sensing means is located at the vicinity of the at least one mirror whereby the movement of the at least one mirror is sensed by the sound sensing means and converted by the conversion means into the one or more electrical signals characterizing the oscillating motion of the at least one mirror.

23 Claims, 2 Drawing Sheets

MEMS DEVICE COMPRISING OSCILLATIONS MEASUREMENTS MEANS

FIELD OF THE INVENTION

The present invention relates to optical systems for scanning or deflecting light beams, and in particularly to systems which comprise periodically moving reflective elements, such as oscillating mirrors.

BACKGROUND OF THE INVENTION

Certain devices such as wafer defect scanners, laser printers, document scanners, projectors and the like make use of a narrow collimated laser beam that is usually scanned across a flat surface along a straight line path. A typical optical scanning system for this purpose employs a tilting flat mirror to deflect the beam. The tilting micro-mirror serves as a central element in many Micro Electro Mechanical Systems ("MEMS") devices. It typically comprises a flat plate (e.g. made of silicon) having a reflecting surface. The plate is held suspended by two torsional hinges aligned along a common torsion (and tilt) axis or a gimbal. The two hinges allow the mirror to tilt clockwise and counterclockwise within a given range of angles, and a collimated laser beam that impinges on the reflecting surface of the mirror is redirected by the mirror to a projection area. The tilting mirror is actuated by an actuation moment that can be provided by well-known MEMS actuation systems. The collimated input beam is aimed perpendicular to the scanning mirror's rotational axis, so that the main deflected ray sweeps a plane in space. Beam collimation generally ensures that the spot size remains substantially the same at both the center and edges of the flat surface.

However, one of the problems associated with the operation of a MEMS type of mirror is how to confirm that the mirror is indeed oscillating, as a failure that causes the mirror(s) to stop oscillating would lead to safety hazards caused by the fact the all of the laser energy that should have been divided at the projection plane will now be focused onto a very small focal point. In addition, certain applications require long term positioning accuracy such as in optical communication applications, e.g. in various optical switches and variable optical attenuators implemented in communication systems, and in light processing devices used in projection technology.

Several attempts were made to solve these challenges. Some of these attempts are described in the following publications.

U.S. Pat. No. 6,538,802 describes a movable MEMS mirror system with a mirror position detection system, such as a capacitive sensor, that is calibrated using a physical stop with a range of movement of the mirror structure. Thus, a drift in the position detection system can be compensated without the need for a separate reference signal source as used in conventional systems.

U.S. Pat. No. 7,252,394 discloses the use of a capacitance sensor embedded in a scanning mirror which is used to detect a change in capacitance from the movement of the reflecting mirror unit. Another alternative described therein is the use of a piezoelectric sensor embedded in a scanning mirror and used to detect a change in current from the movement of reflecting mirror unit.

U.S. Pat. No. 6,275,326 describes a microelectromechanical sensor used to sense the position of a movable element in a microelectromechanical system. The microelectromechanical sensor being a strain gage, a gage of a capacitive, piezo- electric, piezoresistive or pressure type, adjoins the movable element and the resulting signal is fed back to control the component for moving the movable element. In an array of movable elements and sensors, the signal of each sensor is specific to one movable element.

US 20070064300 teaches a method of using in a projection system a microphone for detecting non-soundtrack disturbances, such as sounds or vibrations, generated exteriorly of the projection device, such as from household appliances, people walking in close proximity to projection system, etc. In operation, a signal generator generates a driving square wave signal. The signals are received at a filter from an audio amplifier and contain one or more frequency components that either act to produce the unwanted oscillatory displacements of optical component and/or are the result of non-audio-component sources.

However, there is still a need for a solution which can ensure that the MEMS structure is oscillating as required and will allow determining the phase of these oscillations to ensure that there is no deformation in the mirror's movement which in turn would lead to the distortion of the image that will be projected onto the projection plane.

SUMMARY OF THE INVENTION

It is an object of the present invention to provide a device to allow proper operation of scanning and projecting the scanned image using microelectromechanical systems (MEMS).

It is another object of the present invention to provide a device that can provide a high quality of projected images that can be used among others, in hand held projectors.

Other objects of the invention will become apparent as the description of the invention proceeds.

In accordance with a first embodiment of the present invention there is provided a MEMS apparatus for scanning an optical beam comprising:

a. at least one mirror operative to perform an oscillation motion to a pre-defined rotation angle around a respective mirror rotation axis or a gimbal;

b. a sound sensing means; and c. a conversion means operative to convert sound vibrations detected by the sound sensing means into one or more electrical signals, and wherein the sound sensing means is located at the vicinity of the at least one mirror whereby the movement of the at least one mirror is sensed by the sound sensing means and converted into the one or more electrical signals.

According to a preferred embodiment of the invention, the one or more electrical signals are used in determining whether the at least one mirror is oscillating, and preferably, if the value of the electrical signal is less than a pre-defined value, stopping the operation of the MEMS apparatus.

In accordance with yet another embodiment of the present invention, the one or more electrical signals are used in determining the absolute phase at which the at least one mirror oscillates. This embodiment is based on the fact that the sound sensing device is located at the vicinity of the mirror, and is capable of sensing the frequency of the mirror's oscillations.

By still another embodiment of the invention, the MEMS apparatus is a product of a surface micro machining process (also known as bulk micro-machining process) using materials such as bulk silicon, multi-layer substrate SOI (silicon-on-insulator), DSOI (double SOI), Glass On Silicon and the like, wherein the product comprises a plurality of mirrors and wherein a single sound sensing means is used in generating one or more electrical signals for characterizing oscillations of each of said plurality of mirrors.

According to yet another embodiment of the invention, the MEMS apparatus is a pre-fabricated multi-layer substrate SOI comprising a plurality of mirrors and wherein a single sound sensing means is used to determine the absolute phase at which each of the plurality of mirrors oscillates, e.g. by carrying out a specific Fourier transform for each of the plurality of mirrors derived from the electrical signal received.

By still another preferred embodiment of the invention, the sound sensing means is operative in the audio and/or ultrasonic range and preferably comprises at least one microphone and/or at least one ultrasonic transducer, respectively.

Preferably, the sound sensing means is operative in a range extending from about few tens of Hz to about few tens of kHz.

DETAILED DESCRIPTION OF PREFERRED EMBODIMENTS

A better understanding of the present invention is obtained when the following non-limiting detailed example is considered in conjunction with the accompanying drawings.

Figure 1:
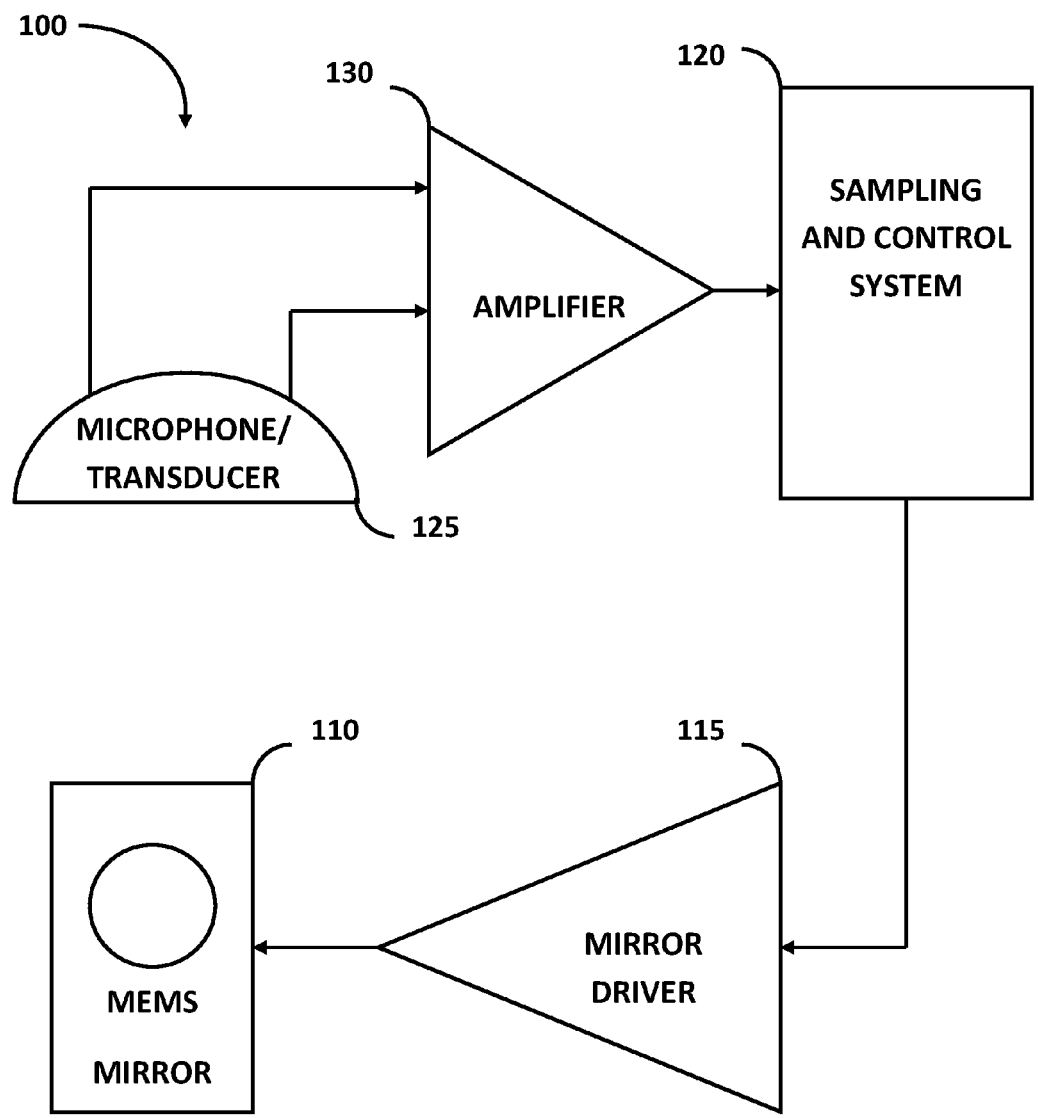
FIG. 1—presents a schematic block diagram of an apparatus for detecting oscillations of a MEMS' mirror.

FIG. 1 illustrates MEMS apparatus 100 construed in accordance with the present invention. The apparatus comprises a MEMS mirror 110 being a resonating mirror which is operative to perform a periodical tilt movement in response to voltage pulses generated by mirror drive 115. The pulses are generated by the mirror driver in response to signals received from controller 120.

The sound sensing means 125 being a microphone and/or ultrasonic transducer, is located at the vicinity of MEMS mirror 110 (either being attached to the mirror or unattached thereto). Preferably, the combination that comprises both the MEMS mirror 110 and the sound sensing means 125 (irrespective whether the two are physically connected to each other or not), is isolated from the rest of the apparatus to ensure that the sounds detected by the sound sensing means are not affected by the operation of other components, thereby enabling more accurate measurement of the mirror oscillations. The sound sensing means 125 picks up the audio/ultrasonic emissions from the MEMS mirror 110 and transforms them into corresponding electrical signals. The electrical signals are fed according to this example into amplifier 130 which amplifies and shapes the signals received from the sound sending means 125 in order to allow optimal sampling conditions. In the alternative, the electrical signals may be fed directly to controller 120 without having them amplified.

Controller 120 is used to sample the signal, have it processed by using time domain or frequency domain signal processing techniques that are known in the art per se, and then optionally extract the amplitude and/or phase information associated with the electrical signals received. This information is then used to synchronize the entire apparatus to the actual position of the MEMS mirror. In addition or in the alternative, the extracted information is used to detect whether there is a failure in the oscillating operation of mirror 110, which in return may cause a shutdown of the MEMS apparatus and the associated devices (e.g. the source for generating the laser beam).

Also, the MEMS apparatus 100 may include more than one MEMS mirror, which operation can be monitored as described above by the sound sensing means.

Figure 2:
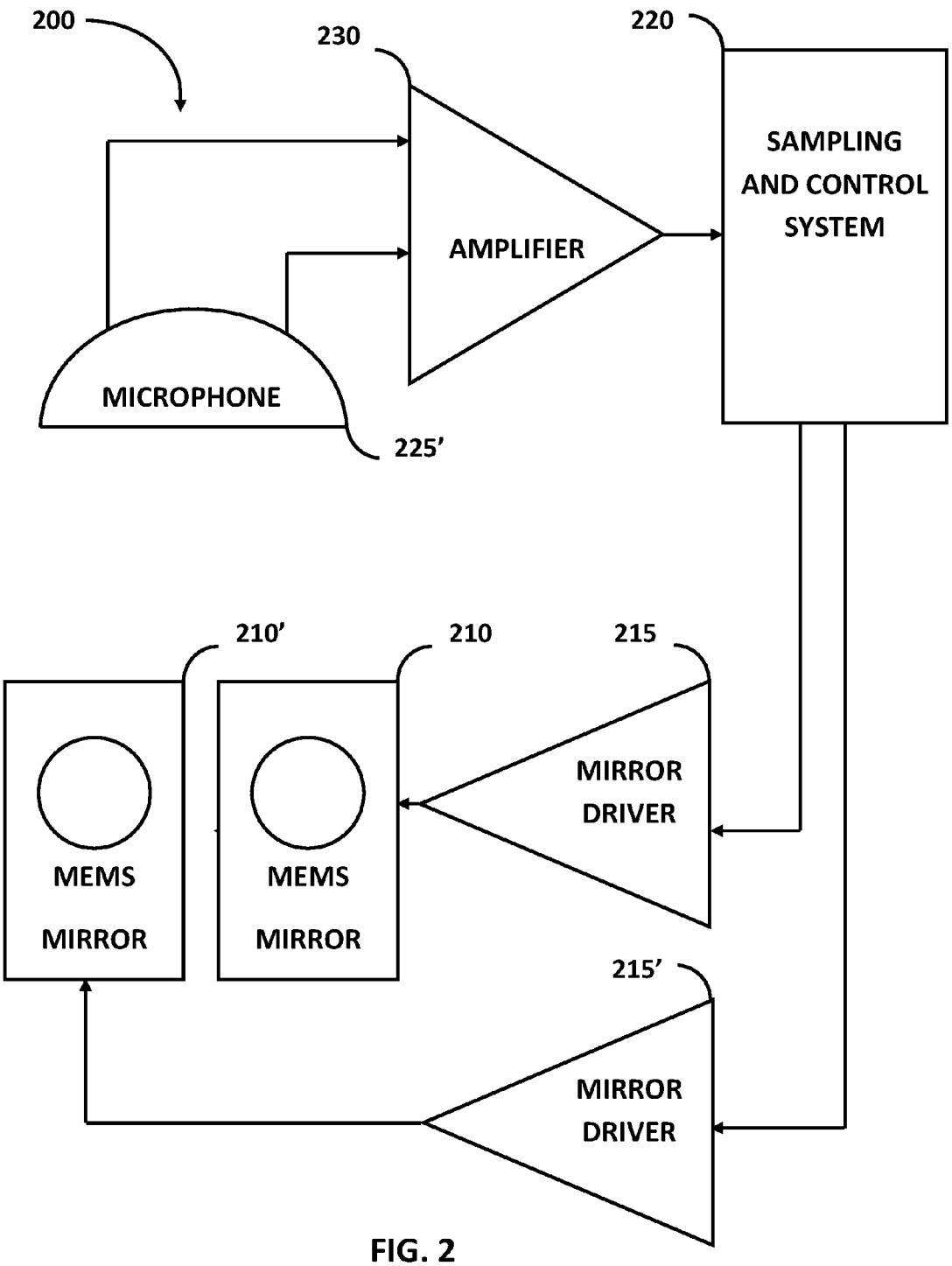
FIG. 2—presents a schematic block diagram of an apparatus for detecting oscillations of a plurality of MEMS' mirrors.

FIG. 2 presents an arrangement similar to that presented in FIG. 1, but with the exception that the sound sensing means 225 illustrated, is operative to derive one or more electrical signals for characterizing the oscillations of each of the plurality of mirrors (210 and 210'), where these mirrors oscillate in response to receiving voltage pulses generated by their respective mirror drives 115 and 115'. The remaining components illustrated in this FIG. 2, operate as described above in connection with FIG. 1, mutates mutandis.

The present invention provides an arrangement that allows monitoring the operation of one or more mirrors, but any similar arrangement that would yield a similar result, should be considered as being encompassed within the scope of the present invention. Furthermore, various calculation methods may be used in order to derive the information from the sound signals which are received by the microphone/ultrasonic transducer.

It is to be understood that the above description only includes some embodiments of the invention and serves for its illustration. Numerous other ways for constructing the optical device provided by the present invention may be devised by a person skilled in the art without departing from the scope of the invention, and are thus encompassed by the present invention.

The invention claimed is:

1. A MEMS apparatus comprising:
   at least one mirror configured to perform an oscillation motion to a pre-defined rotation angle around a mirror rotation;
   a sound sensor in direct physical contact with the at least one mirror and configured to sense sound vibrations indicative of movement of the at least one mirror; and
   a conversion circuit configured to convert the sound vibrations detected by the sound sensor into one or more electrical signals.

2. An apparatus according to claim 1, wherein said one or more electrical signals are used in determining whether said mirror is oscillating.

3. An apparatus according to claim 2, further comprising a control circuit configured to control the oscillation motion of said at least one mirror, wherein if the value of said one or more electrical signals is less than a pre-defined value, said control circuit ceases operation of said MEMS apparatus.

4. An apparatus according to claim 1, wherein said one or more electrical signals are used in determining an absolute phase at which said mirror oscillates.

5. An apparatus according to claim 1, wherein said sound sensor is used in generating one or more electrical signals for characterizing oscillating motion of said at least one mirror.

6. An apparatus according to claim 1, wherein said sound sensor is operative in the audio and/or ultrasonic range.

7. An apparatus according to claim 6, wherein said sound sensor comprises at least one microphone.

8. An apparatus according to claim 6, wherein said sound sensor comprises at least one ultrasonic transducer.

9. An apparatus according to claim 1, wherein said sound sensor is operative in a range extending from about few tens of Hz to about few tens of kHz.

10. An apparatus, comprising:
    a MEMS mirror;
    a control circuit configured to drive an oscillating movement of said MEMS mirror;

a sensing circuit in direct physical contact with the MEMS mirror and configured to sense sound produced by oscillating movement of said MEMS mirror;

wherein said control circuit is further configured to process signals output from said sensing circuit that are indicative of sensed sound to detect at least one of an amplitude and a phase of said oscillating movement.

11. The apparatus of claim 10, wherein said control circuit is further configured to process signals output from said sensing circuit that are indicative of sensed sound to detect a position of said MEMS mirror.

12. The apparatus of claim 10, wherein the sensed sound comprises audio sound.

13. The apparatus of claim 10, wherein the sensed sound comprises ultrasonic sound.

14. The apparatus of claim 10, wherein said control circuit is further configured to process signals output from said sensing circuit that are indicative of sensed sound to detect failure of said oscillating movement.

15. The apparatus of claim 14, wherein said control circuit is further configured to turn off a light source whose output is directed at the MEMS mirror in response to detected failure of said oscillating movement.

16. The apparatus of claim 10, wherein said control circuit is further configured to process signals output from said sensing circuit that are indicative of sensed sound to synchronize operation of other devices with the oscillating movement of the MEMS mirror.

17. An apparatus, comprising:
a plurality of MEMS mirrors;
a control circuit configured to drive oscillating movement of said plurality of MEMS mirrors;
a sensing circuit configured to sense sound produced by said oscillating movement of said plurality of MEMS mirrors;

wherein said control circuit is further configured to process signals output from said sensing circuit that are indicative of said sensed sound to detect at least one of an amplitude and a phase of said oscillating movement.

18. The apparatus of claim 17, wherein said control circuit is further configured to process signals output from said sensing circuit that are indicative of sensed sound to detect a position of at least one of said MEMS mirrors.

19. The apparatus of claim 17, wherein the sensed sound comprises audio sound.

20. The apparatus of claim 17, wherein the sensed sound comprises ultrasonic sound.

21. The apparatus of claim 17, wherein said control circuit is further configured to process signals output from said sensing circuit that are indicative of said sensed sound to detect failure of said oscillating movement associated with at least one of said MEMS mirrors.

22. The apparatus of claim 21, wherein said control circuit is further configured to turn off a light source that has an output directed at said MEMS mirrors in response to the detected failure of said oscillating movement.

23. The apparatus of claim 17, wherein said control circuit is further configured to process signals output from said sensing circuit that are indicative of said sensed sound to synchronize operation of other devices with the oscillating movement of said MEMS mirrors.

\* \* \* \* \*